United States Patent
He et al.

(10) Patent No.: US 12,272,754 B2
(45) Date of Patent: Apr. 8, 2025

(54) THIN FILM TRANSISTOR WITH SILICON NANOWIRE CHANNEL, DISPLAY SUBSTRATE, AND DISPLAY DEVICE

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Zhi Wang, Beijing (CN); Feng Guan, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 517 days.

(21) Appl. No.: 17/761,549

(22) PCT Filed: May 18, 2021

(86) PCT No.: PCT/CN2021/094236
§ 371 (c)(1),
(2) Date: Mar. 17, 2022

(87) PCT Pub. No.: WO2021/254067
PCT Pub. Date: Dec. 23, 2021

(65) Prior Publication Data
US 2022/0223745 A1 Jul. 14, 2022

(30) Foreign Application Priority Data
Jun. 18, 2020 (CN) .......................... 202010562553.1

(51) Int. Cl.
*H01L 29/786* (2006.01)
*H01L 29/06* (2006.01)
(Continued)

(52) U.S. Cl.
CPC .... *H01L 29/78696* (2013.01); *H01L 29/0673* (2013.01); *H01L 29/41733* (2013.01);
(Continued)

(58) Field of Classification Search
CPC ................................ H01L 29/78696
(Continued)

(56) References Cited

U.S. PATENT DOCUMENTS

| 6,064,086 A | 5/2000 | Nakagawa et al. |
| 9,335,365 B2 | 5/2016 | Huang et al. |

(Continued)

FOREIGN PATENT DOCUMENTS

| CN | 109309100 A | 2/2019 |
| CN | 110729303 A | 1/2020 |

OTHER PUBLICATIONS

Mingkun Xu. "Self-Positioned and Homo Hetero-Epitaxy In-Plane Growth Of Silicon Nanowires." A doctorate dissertation, Nanjing University, May 20, 2016.
(Continued)

*Primary Examiner* — Ajay Arora
(74) *Attorney, Agent, or Firm* — IPro, PLLC (57) ABSTRACT

A thin film transistor, a manufacturing method thereof, a display substrate, and a display device are provided. The thin film transistor includes: a substrate, an active layer, a gate, a source and a drain. The active layer is arranged on the substrate and formed as a grid, including silicon nanowires extending along a first direction, the active layer includes source and drain regions oppositely arranged along the first direction, and a channel region located therebetween. The gate is arranged on the substrate, and an orthographic projection of the gate onto the substrate overlaps with orthographic projections for silicon nanowires in the channel region onto the substrate. The source and drain are arranged
(Continued)

on the substrate, the source contacts silicon nanowires in the source region, and the drain contacts silicon nanowires in the drain region.

12 Claims, 4 Drawing Sheets

(51) Int. Cl.
  *H01L 29/417* (2006.01)
  *H01L 29/66* (2006.01)
(52) U.S. Cl.
  CPC .... *H01L 29/6675* (2013.01); *H01L 29/78618* (2013.01); *H01L 29/78663* (2013.01)
(58) Field of Classification Search
  USPC ........................................................ 257/288
  See application file for complete search history.

(56) References Cited

U.S. PATENT DOCUMENTS

2005/0181587 A1\* 8/2005 Duan .................. H01L 27/1292
  438/551
2020/0193932 A1\* 6/2020 Liu .................... H01L 29/41733

OTHER PUBLICATIONS

PCT/CN2021/094236—written opinion + ISR.

\* cited by examiner

THIN FILM TRANSISTOR WITH SILICON NANOWIRE CHANNEL, DISPLAY SUBSTRATE, AND DISPLAY DEVICE

CROSS-REFERENCE TO RELATED APPLICATIONS

This application claims priority to Chinese Patent Application No. 202010562553.1 filed in China on Jun. 18, 2020, the entire content of which is hereby incorporated by reference.

TECHNICAL FIELD

The present disclosure relates to the technical field of display, and particularly to a thin film transistor, a manufacturing method thereof, a display substrate, and a display device.

BACKGROUND

With the continuous development of display technologies, Active-Matrix Organic Light-Emitting Diode (abbreviated as AMOLED) display devices and Liquid Crystal Displays (abbreviated as LCD) have widely used. Great attention is paid to Thin Film Transistors (abbreviated as TFT), which are core devices of the AMOLED display devices and the LCDs. However, the thin film transistors currently used in the display devices have poor characteristics, causing poor display quality of the display devices.

SUMMARY

The present disclosure is to provide a thin film transistor, a manufacturing method thereof, a display substrate, and a display device.

In order to achieve this, the present disclosure provides the following technical solutions:

In a first aspect of the present disclosure, a thin film transistor is provided, the thin film transistor includes:
a substrate;
an active layer, arranged on the substrate, wherein the active layer is formed as a grid-shaped structure, and the active layer includes a plurality of silicon nanowires extending along a first direction, the active layer includes a source electrode region and a drain electrode region oppositely arranged along the first direction, and a channel region located between the source electrode region and the drain electrode region;
a gate electrode, arranged on the substrate, wherein the gate electrode extends along a second direction, wherein the second direction intersects with the first direction, and an orthographic projection of the gate electrode onto the substrate overlaps with an orthographic projection of the plurality of silicon nanowires in the channel region onto the substrate; and
a source electrode and a drain electrode, arranged on the substrate, wherein the source electrode is in contact with the plurality of silicon nanowires in the source electrode region and the drain electrode is in contact with the plurality of silicon nanowires in the drain electrode region.

Optionally, the source electrode is formed as a grid-shaped structure and the source electrode includes a plurality of source electrode patterns extending along the second direction, wherein each source electrode pattern is in contact with the plurality of silicon nanowires in the source electrode region;
the drain electrode is formed as a grid-shaped structure and includes a plurality of drain electrode patterns extending along the second direction, wherein each drain electrode pattern is in contact with the plurality of silicon nanowires in the drain electrode region.

Optionally, the thin film transistor further includes a dielectric layer, wherein the dielectric layer includes a plurality of protruding structures arranged in a grid shape, the protruding structures extend along the first direction, and the protruding structures each includes two first side faces extending along the first direction;
The silicon nanowires included in the active layer are in one-to-one correspondence with first side faces, and each of the silicon nanowires extends along a corresponding first side face.

Optionally, the thin film transistor further includes:
a buffer layer, located between the substrate and the active layer, wherein the buffer layer is reused as the dielectric layer;
a gate electrode insulating layer, which is located on a side of the active layer facing away from the substrate, and the orthographic projection of the gate electrode insulating layer onto the substrate covers the orthographic projection of the channel region onto the substrate;
the gate electrode is located on a side of the gate electrode insulating layer facing away from the substrate;
the thin film transistor further includes an interlayer insulating layer, located on a side of the gate electrode facing away from the substrate;
the source electrode and the drain electrode are both located on a side of the interlayer insulating layer facing away from the substrate, and the source electrode is in contact with a plurality of silicon nanowires in the source electrode region via a first via hole formed in the interlayer insulating layer; and the drain electrode is in contact with the plurality of silicon nanowires in the drain electrode region via a second via hole formed in the interlayer insulating layer.

Optionally, the thin film transistor further includes:
a gate electrode insulating layer, located between the substrate and the active layer, wherein the gate electrode insulating layer is reused as the dielectric layer;
the gate electrode is located between the gate electrode insulating layer and the substrate, and the orthographic projection of the gate electrode onto the substrate is located inside an orthographic projection of the gate electrode insulation layer onto the substrate; and
the source electrode and the drain electrode are both located on a side of the active layer facing away from the substrate.

Optionally, the substrate includes a glass substrate or a flexible substrate.

Based on said technical solutions of the thin film transistor, in a second aspect of the present disclosure, a display subtract including said thin film transistor is provided.

Based on said technical solution of the display substrate, in a third aspect of the present disclosure, a display device including said display substrate is provided.

Based on said technical solution of the thin film transistor, in a fourth aspect of the present disclosure, a manufacturing method of the thin film transistor is provided, and the manufacturing method includes:
providing the substrate;

manufacturing a plurality of silicon nanowires extending along a first direction on the substrate, wherein the plurality of silicon nanowires form an active layer of a grid-shaped structure, the active layer includes a source electrode region and a drain electrode region which are oppositely arranged along the first direction, and the active layer includes a channel region located between the source electrode region and the drain electrode region;

manufacturing a gate electrode on the substrate, wherein the gate electrode extends a the second direction, the second direction intersects with the first direction, an orthographic projection of the gate electrode onto the substrate overlaps with an orthographic projection of the plurality of silicon nanowires in the channel region onto the substrate; and manufacturing a source electrode and a drain electrode on the substrate, wherein the source electrode is in contact with the plurality of silicon nanowires in the source electrode region, and the drain electrode is in contact with the plurality of silicon nanowires in the drain electrode region.

Optionally, the substrate includes a glass substrate; the step of manufacturing the plurality of silicon nanowires extending along the first direction on the substrate specifically includes:

forming a dielectric layer on the glass substrate, wherein a surface of the dielectric layer facing away from the glass substrate includes a plurality of protruding structures arranged in a grid shape, the protruding structures extend along the first direction and the protruding structures each include two first side faces extending along the first direction;

forming an indium source pattern on a surface of the dielectric layer facing away from the glass substrate by using an indium tin oxide material, wherein the indium source pattern extends along the second direction, and an orthographic projection of the indium source pattern onto the glass substrate overlaps with an orthographic projection of an end of the plurality of protruding structures along the first direction onto the glass substrate;

performing a plasma bombardment treatment on the indium source pattern to form indium metal guiding particles distributed on a surface of the indium source pattern; and forming an amorphous silicon film layer, wherein the amorphous silicon film layer covers all the protruding structures and regions between adjacent protruding structures, and controlling the indium metal guiding particles to move along the first direction in inert reducing atmosphere so as to generate the plurality of silicon nanowires along the first side faces.

Optionally, the step of controlling the indium metal guiding particles to move along the first direction in inert reducing atmosphere so as to generate the plurality of silicon nanowires along the first side faces specifically includes:

heating the substrate to form an alloy droplet of amorphous silicon and indium metal, wherein a silicon crystal nucleus is precipitated in a case that the concentration of silicon in the alloy droplet is supersaturated;

controlling the alloy droplet to move in the first direction to pull the precipitated silicon nucleus to grow into the plurality of silicon nanowires along the first side faces.

Optionally, the manufacturing method further includes:

manufacturing an organic film layer on the substrate after providing the substrate;

peeling off the glass substrate after the manufacturing of the thin film transistor is completed.

Optionally, the manufacturing method further includes:

converting an amorphous silicon material remaining in the amorphous silicon film layer into polycrystalline silicon after forming the plurality of silicon nanowires extending along the first direction.

Optionally, the manufacturing method further includes:

performing a passivation on the plurality of silicon nanowires after forming the plurality of silicon nanowires extending along the first direction.

BRIEF DESCRIPTION OF THE DRAWINGS

The drawings described herein are to provide a further understanding of the disclosure and form a part of the disclosure. Exemplary embodiments of the disclosure and descriptions thereof are to explain the disclosure and not intended to form improper limits to the disclosure. In the drawings.

DESCRIPTION OF REFERENCE NUMERALS IN THE DRAWINGS

10—substrate, 20—active layer,
201—silicon nanowire, 202—source electrode region,
203—drain electrode region, 204—channel region,
30—gate electrode, 40—source electrode pattern,
41—first conductive connection portion, 50—drain pattern,
51—second conductive connection portion, 60—dielectric layer,
601—protruding structure, 602—guiding groove,
GI—gate electrode insulating layer, ILD—interlayer insulating layer,
70—indium source pattern, 701—indium metal guiding particles,
80—amorphous silicon film layer, 90—alloy droplet.

DETAILED DESCRIPTION

In order to further explain a thin film transistor, a manufacturing method thereof, a display substrate, and a display device provided by embodiments of the present disclosure, detailed descriptions are described in conjunction with the figures.

Figure 1:
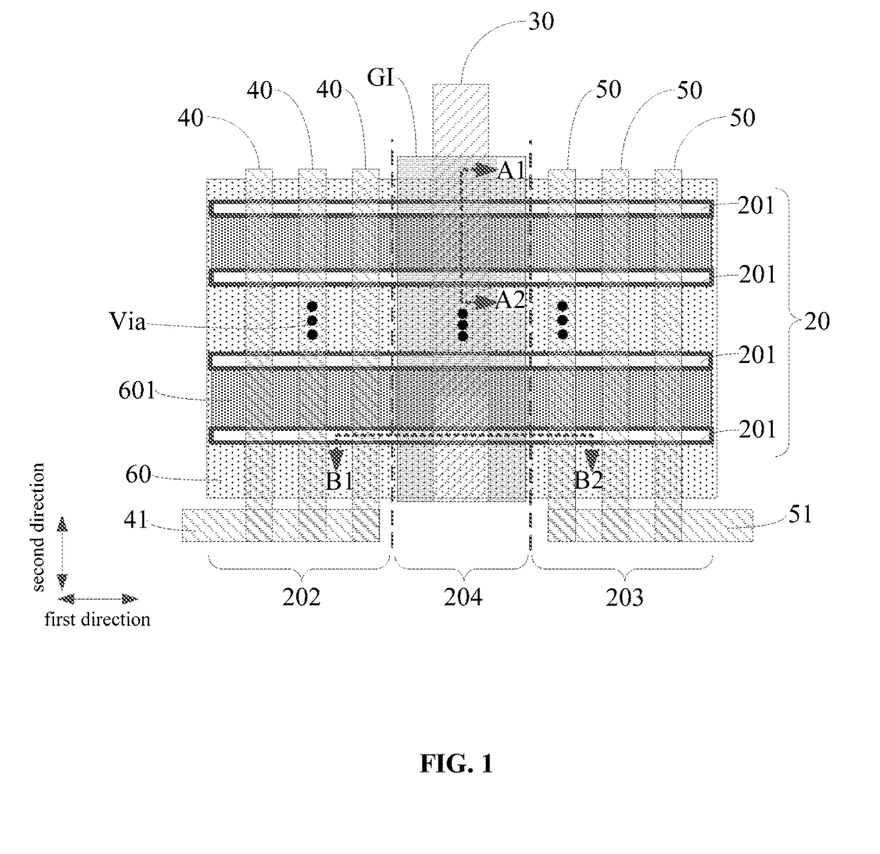
FIG. 1 is a top view of a thin film transistor according to an embodiment of the present disclosure.
Figure 2A:
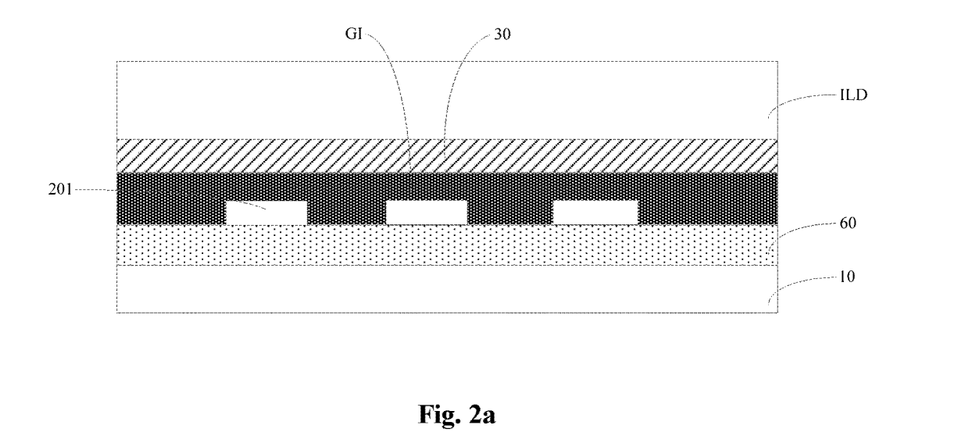
FIG. 2a is a schematic cross-sectional view along the direction A1A2 in FIG. 1.
Figure 2B:
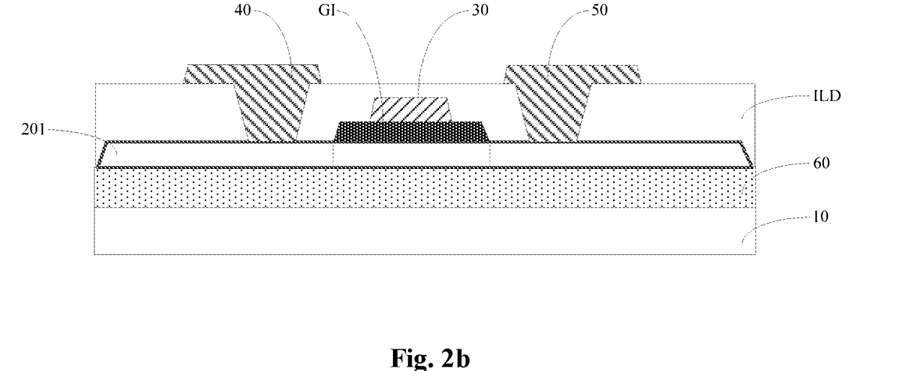
FIG. 2b is a schematic cross-sectional view along the direction B1B2 in FIG. 1.

With reference to FIGS. 1 to 2b, in an embodiment of the present disclosure a thin film transistor is provided, which includes: a substrate 10, an active layer 20 arranged on the substrate 10, a gate electrode 30, a source electrode, and a drain electrode, wherein the active layer 20 is formed as a grid-shaped structure, and the active layer 20 includes a plurality of silicon nanowires 201 extending along a first direction, the active layer 20 includes a source electrode region 202 and a drain electrode region 203 which are oppositely arranged along the first direction, and a channel region 204 located between the source electrode region 202 and the drain electrode region 203; the gate electrode 30 extends along a second direction, wherein the second direction intersects with the first direction; an orthographic projection of the gate electrode 30 onto the substrate 10 overlaps with an orthographic projection of the plurality of silicon nanowires 201 in the channel region 204 onto the substrate 10 respectively; and the source electrode is in contact with the plurality of silicon nanowires 201 in the source electrode region 202 respectively, and the drain electrode is in contact with the plurality of silicon nanowires 201 in the drain electrode region 203 respectively.

Specifically, the active layer 20 of the thin film transistor is formed as a grid-shaped structure, and the active layer 20 includes the plurality of silicon nanowires 201 extending along the first direction, illustratively, the plurality of silicon nanowires 201 are sequentially arranged along the second direction, and the second direction is perpendicular to the first direction. Illustratively, the plurality of silicon nanowires 201 are arranged with an equal space. Illustratively, the plurality of silicon nanowires 201 are divided into groups of silicon nanowires 201, each group of silicon nanowires 201 includes two adjacent silicon nanowires 201, the distances between the two silicon nanowires 201 in each of groups of silicon nanowires 201 are equal, and the minimum distances between any two adjacent groups of silicon nanowires 201 are equal.

The active layer 20 includes the channel region 204, the source electrode region 202, and the drain electrode region 203. Illustratively, the source electrode region 202 and the drain electrode region 203 are oppositely arranged along the first direction, and the channel region 204 is located between the source electrode region 202 and the drain electrode region 203. Illustratively, each of the silicon nanowires 201 includes a portion located in the channel region 204, a portion located in the source electrode region 202, and a portion located in the drain electrode region 203. The conductivity of the portions of the silicon nanowire 201 that are located in the source electrode region 202 and the drain electrode region 203 is better than the conductivity of the portion of the silicon nanowire 201 located in the channel region 204. Illustratively, the portion of the silicon nanowire 201 located in the source electrode region 202 has a conductivity gradually decreasing in a direction towards the channel region 204. Illustratively, the portion of the silicon nanowires 201 located in the drain electrode region 203 has a conductivity gradually decreasing in a direction towards the channel region 204.

The thin film transistor further includes the gate electrode 30. Illustratively, the gate electrode 30 extends along the second direction and the orthographic projection of the gate electrode 30 onto the substrate 10 overlaps with an orthographic projection of each the plurality of silicon nanowires 201 in the channel region 204 onto the substrate 10. Illustratively, along the second direction, the length of the gate electrode 30 is greater than the length of the channel region 204, and along a direction perpendicular to the second direction, the width of the gate electrode 30 is less than the width of the channel region 204. Illustratively, the gate electrode 30 includes a first gate electrode pattern, a second gate electrode pattern, and a third gate electrode pattern which are sequentially stacked in a direction away from the substrate 10, wherein the first gate electrode pattern and the third gate electrode pattern are made of an Mo metal material, and the second gate electrode pattern is made of an Al metal material.

The thin film transistor further includes a gate electrode insulating layer GI which is located between the gate electrode 30 and the active layer 20 and can prevent contact between the gate electrode 30 and the active layer 20. Illustratively, the orthographic projection of the channel region 204 onto the substrate 10 is located inside the orthographic projection of the gate electrode insulating layer GI on the substrate 10; the orthographic projection of the gate electrode 30 onto the substrate 10 is located inside the orthographic projection of the gate electrode insulating layer GI onto the substrate 10. Illustratively, the gate electrode insulating layer GI may be made of an $SiO_x$ material.

The thin film transistor further includes the source electrode and the drain electrode. The source electrode and the drain electrode are both located on a side of the active layer 20 facing away from the substrate 10, the source electrode can be in contact with each of the plurality of silicon nanowires 201 in the source electrode region 202, and the drain electrode can be in contact with each of the plurality of silicon nanowires 201 in the drain electrode region 203. Illustratively, the source electrode and the drain electrode are arranged in the same layer and made of the same material. In such a manner, the source electrode and the drain electrode can be formed in the same patterning process, thereby better simplifying the manufacturing process of the thin film transistor and saving manufacturing costs. It should be noted that after the manufacturing of the source and drain electrodes is completed, a passivation layer may be formed on the substrate, and the passivation layer may cover an area where the thin film transistor is located. By forming a via hole Via in the passivation layer, the source electrode and the drain electrode can be electrically connected with a conductive film layer on a side of the passivation layer facing away from the substrate. Also, by forming the via hole in the passivation layer and an interlayer insulating layer ILD, the gate electrode can be electrically connected with the conductive film layer located on a side of the passivation layer facing away from the substrate. As shown in FIG. 1, Via is the via hole in the passivation layer, and only the location of the via is illustrated in FIG. 1, but the passivation layer is not shown, as the passivation layer is generally a transparent structure.

It should be noted that since the via hole Via does not extend to the active layer 20, the silicon nanowires 201 can also be arranged below the via hole Via.

It should be noted that, said "same layer" refers to a layer structure formed as follows: a film layer for forming a specific pattern is formed by the same film forming process and the same mask is utilized to form such layer structure in one-shot patterning process. Depending on the different particular patterns, the one-shot patterning process may include multiple exposure, development, or etching processes, the formed specific pattern in the layer structure can be continuous or discontinuous, and the specific pattern may also be at different heights or have different thicknesses.

Figure 8:
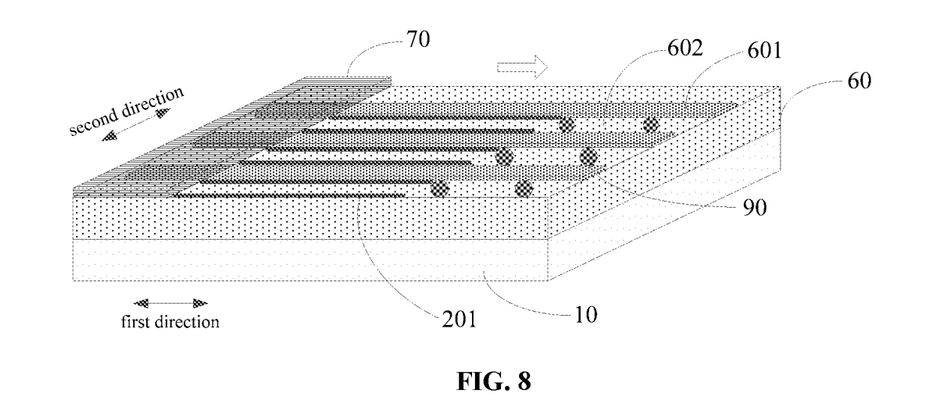
FIG. 8 is schematic diagrams of forming silicon nanowires according to an embodiment of the present disclosure.

It is noted that the silicon nanowires 201 are illustrated in both FIGS. 1 and 8, the silicon nanowires 201 are illustrated as black lines in FIG. 8. In order to illustrate the top-view structure of the thin film transistor more clearly, the silicon nanowires 201 are illustrated in a pattern having a certain width in FIG. 1. Illustratively, the silicon nanowires 201 have a line width of about 500 nm, and the source electrode pattern 40 and the drain electrode pattern 50 have a width of about 1 µm in a direction perpendicular to the second direction.

According to said specific structure of the thin film transistor, in the thin film transistor according to embodiments of the present disclosure, by forming the active layer 20 into the grid-shaped structure including the plurality of silicon nanowires 201, interface traps between the gate electrode insulating layer GI and the active layer 20 in the thin film transistor can be reduced significantly, the mobility characteristics of the thin film transistor can be effectively improved, thereby improving the working efficiency of the thin film transistor. When the thin film transistor according to embodiments of the present disclosure is applied to the display device, the operating performance of the display device and the display quality can be improved significantly.

As shown in FIG. 1, in some embodiments, the source electrode is formed as a grid-shaped structure, the source electrode includes a plurality of source electrode patterns 40 extending along the second direction, and each source electrode pattern 40 is in contact with each of the plurality of silicon nanowires 201 in the source electrode region 202; the drain electrode is formed as a grid-shaped structure, the drain electrode includes a plurality of drain electrode patterns 50 extending along the second direction, each drain electrode pattern 50 is in contact with each of the plurality of silicon nanowires 201 in the drain electrode region 203.

Specifically, the specific structures of the source electrode and the drain electrode may vary, and illustratively, the source electrode is formed as the grid-shaped structure, the source electrode includes the plurality of source electrode patterns 40 extending along the second direction, and each source electrode pattern 40 can contact the plurality of silicon nanowires 201 in the source electrode region 202. Illustratively, the plurality of source electrode patterns 40 are equally spaced along the first direction. Illustratively, the plurality of source electrode patterns 40 can be electrically connected with each other through a first conductive connection portion 41. Illustratively, the first conductive connection portion 41 and the source electrode patterns 40 to which the first conductive connection portion 41 is electrically connected can be formed as an integral structure. Illustratively, an orthographic projection of the first conductive connection portion 41 onto the substrate can fall within an orthographic projection of the dielectric layer 60 onto the substrate, for example, by a metal in a different layer connecting to each of the source electrode patterns 40 through via holes; or, the first conductive connection portion 41 can be located at an end of the source electrode pattern 40, so that the first conductive connection portion 41 and the source electrode patterns 40 to which the first conductive connection portion 41 is electrically connected are formed as the integral structure. The specific manner is not limited hereby.

Illustratively, the drain electrode is formed as a grid-shaped structure, the drain electrode includes a plurality of drain electrode patterns 50 extending along the second direction, and each drain electrode pattern 50 can contact each of the plurality of silicon nanowires 201 in the drain electrode region 203. Illustratively, the plurality of drain electrode patterns 50 are equally spaced along the first direction. Illustratively, the plurality of drain electrode patterns 50 can be electrically connected with each other through a second conductive connection 51. Illustratively, the second conductive connection portion 51 and the drain electrode patterns 50 to which the second conductive connection portion 51 is electrically connected can be formed as an integral structure. Illustratively, an orthographic projection of the second conductive connection portion 51 onto the substrate may fall within an orthographic projection of the dielectric layer 60 onto the substrate, for example, by a metal in a different layer connecting to the drain electrode patterns 50 through via holes; or, the second conductive connection portion 51 may be located at an end of the drain electrode pattern 50, so that the second conductive connection portion 51 and the drain electrode patterns 50 to which the second conductive connection portion 51 is electrically connected are formed as an integral structure. The specific manner is not limited hereby.

In the thin film transistor according to the above-mentioned embodiments, by arranging both the source electrode and the drain electrode to form the grid-shaped structure, a point contact can be formed between the source electrode and the active layer, and a point contact can be formed between the drain electrode and the active layer, thereby reducing the contact resistance between the source electrode and the active layer, and the contact resistance between the drain electrode and the active layer, and effectively improving the characteristics of the thin film transistor.

As shown in FIG. 8, in some embodiments, the thin film transistor further includes the dielectric layer 60, wherein the dielectric layer 60 includes a plurality of protruding structures 601 arranged in a grid shape, the protruding structures 601 extend along the first direction, and the protruding structure 601 include two first side faces extending along the first direction; the silicon nanowires 201 included in the active layer 20 are in one to one correspondence with the first side faces, and each of the silicon nanowires 201 extends along a corresponding first side face.

Specifically, in a case that the active layer 20 includes the plurality of silicon nanowires 201 extending along the first direction, the specific position for forming the plurality of silicon nanowires 201 may vary. Illustratively, a dielectric layer 60 may be formed on the substrate 10 first, and the plurality of silicon nanowires 201 can be formed on a side of the dielectric layer 60 facing away from the substrate 10.

Illustratively, the dielectric layer 60 includes the plurality of protruding structures 601 arranged in the grid shape, each of the protruding structures 601 extends along the first direction, and the plurality of protruding structures 601 are arranged at intervals along the second direction. The protruding structure 601 includes two first side faces extending along the first direction and a top face facing away from the substrate 10. Illustratively, in a direction perpendicular to the first direction, a cross-section of the protruding structures 601 is rectangular.

In the thin film transistor according to the above-mentioned embodiment, the silicon nanowires 201 are arranged by growing along the first side faces of the protruding structures 601, and each of the silicon nanowires 201 can extend along a corresponding first side face, so that the specific shape and distribution of the silicon nanowires 201 to be formed can be controlled by controlling the specific shape and structure of the protruding structures 601, thereby facilitating the formation of the grid-shaped active layer 20 according to needs.

As shown in FIGS. 1 and 2b, in some embodiments, the thin film transistor further includes:
- a buffer layer, located between the substrate and the active layer, wherein the buffer layer is reused as the dielectric layer 60;
- a gate electrode insulating layer GI, the gate electrode insulating layer GI is located on a side of the active layer 20 facing away from the substrate 10, and an orthographic projection of the gate electrode insulating layer GI onto the substrate 10 covers an orthographic projection of the channel region 204 onto the substrate 10;
- the gate electrode 30 is located on a side of the gate electrode insulating layer GI facing away from the substrate 10;
- the thin film transistor further includes an interlayer insulating layer ILD, the interlayer insulating layer is located on a side of the gate electrode 30 facing away from the substrate 10;
- the source electrode and the drain electrode are both located on a side of the interlayer insulating layer ILD facing away from the substrate 10, and the source electrode is in contact with each of the plurality of silicon nanowires 201 in the source electrode region 202 via a first via hole formed in the interlayer insulating layer ILD; and the drain electrode is in contact with each of the plurality of silicon nanowires 201 in the drain electrode region 203 via a second via hole formed in the interlayer insulating layer ILD.

Specifically, the thin film transistor is formed as a top gate type structure, the thin film transistor includes a buffer layer located between the substrate 10 and the active layer 20, and the buffer layer is reused as the dielectric layer 60;

The active layer 20 is formed on a surface of the buffer layer facing away from the substrate 10; the gate electrode insulating layer GI is located on a side of the active layer 20 facing away from the substrate 10, and an orthographic projection of the gate electrode insulating layer GI onto the substrate 10 covers an orthographic projection of the channel region 204 of the active layer 20 onto the substrate 10; the gate electrode 30 is located on a side of the gate electrode insulating layer GI facing away from the substrate 10, and the gate electrode 30 is insulated from the active layer 20; the interlayer insulating layer ILD is located on a side of the gate electrode 30 facing away from the substrate 10, the interlayer insulating layer ILD fully covers the gate electrode 30 and the gate electrode insulating layer GI, the plurality of first via holes, and the plurality of second via holes are formed in the interlayer insulating layer ILD; the source electrode and the drain electrode are both located at a side of the interlayer insulating layer ILD facing away from the substrate 10, and the source electrode is in contact with each of the plurality of silicon nanowires 201 in the source electrode region 202 through the first via hole; and the drain electrode is in contact with each the plurality of silicon nanowires 201 in the drain electrode region 203 through the second via hole.

By forming thin film transistor as the top gate type structure, so that the interlayer insulating layer ILD exists between the active layer 20 and the source electrode and the drain electrode, the silicon nanowires 201 in the active layer 20 cannot be easily damaged when the source electrode and the drain electrode are formed by etching.

Figure 3:
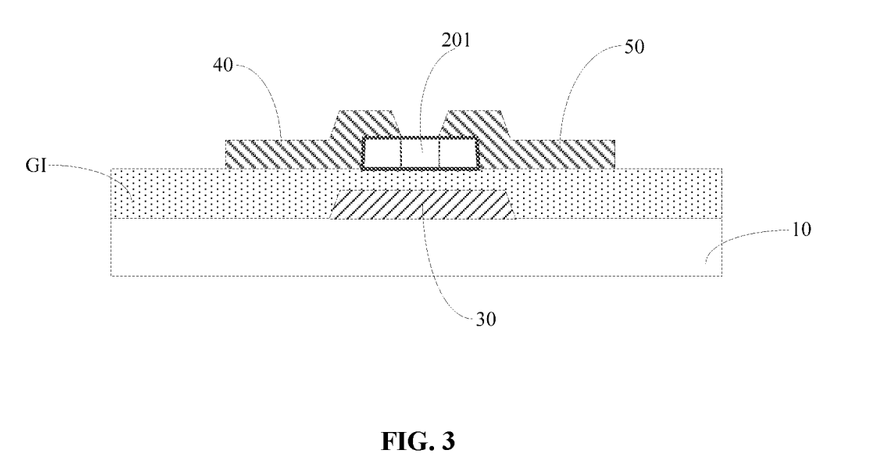
FIG. 3 is a schematic cross-sectional view of a thin film transistor having a bottom gate structure according to an embodiment of the present disclosure.

As shown in FIG. 3, in some embodiments, the thin film transistor further includes: a gate electrode insulating layer GI, located between the substrate 10 and the active layer 20, wherein the gate electrode insulating layer GI is reused as the dielectric layer 60; the gate electrode 30 is located between the gate electrode insulating layer GI and the substrate 10, an orthographic projection of the gate electrode 30 onto the substrate 10 is located inside an orthographic projection of the gate electrode insulating layer GI onto the substrate 10; and both the source electrode (including the source electrode pattern 40) and the drain electrode (including the drain electrode pattern 50) are located on a side of the active layer (including the silicon nanowires 201) facing away from the substrate.

Specifically, the thin film transistor is formed as the bottom gate type structure, the gate electrode 30 is formed on the substrate 10, the gate electrode insulating layer GI is located on a side of the gate electrode 30 facing away from the substrate 10, and can fully cover the gate electrode 30, and the gate electrode insulating layer GI is reused as the dielectric layer 60; the active layer is located on a surface of the gate electrode insulating layer GI facing away from the substrate 10; the source electrode and the drain electrode are both located on a side of the active layer facing away from the substrate, the source electrode can be in direct contact with the plurality of silicon nanowires located in the source electrode region, and the drain electrode can be in direct contact with the plurality of silicon nanowires located in the drain electrode region.

It is noted that in the thin film transistor of the bottom gate type structure, an orthographic projection of the active layer onto the substrate, an orthographic projection of the source electrode onto the substrate, and an orthographic projection of the drain electrode onto the substrate are all located inside an orthographic projection of the gate electrode insulating layer onto the substrate.

In some embodiments, the substrate 10 includes a glass substrate or a flexible substrate.

Specifically, the type of the substrate may be various, and illustratively, the substrate includes the glass substrate or the flexible substrate.

In a case that the glass substrate is selected as the substrate, the thin film transistor according to the embodiments forms a plurality of silicon nanowires 201 on the glass substrate, and the plurality of silicon nanowires 201 together form the active layer 20 of the grid-shaped structure, so that interface traps between the gate electrode insulating layer GI and the active layer 20 in the thin film transistor can be reduced significantly, and the mobility characteristics of the thin film transistor can be effectively improved. In a case that the thin film transistor according to said embodiments is applied to the display device, the operating performance of the display device and the display quality can be improved significantly.

In a case that the flexible substrate is selected as the substrate, the thin film transistor according to said embodiments can be applied in the field requiring flexibility and stretchability. The thin film transistor can be applied to an AMOLED display device, which is beneficial to improve operating performances of the AMOLED display device, resulting in a greater breakthrough for the AMOLED.

Embodiments of the present disclosure further provide a display substrate which includes the thin film transistor provide by the above-mentioned embodiments.

In the thin film transistor according to the above-mentioned embodiments, by forming the active layer 20 as the grid-shaped structure including the plurality of silicon nanowires 201, interface traps between the gate electrode insulating layer GI and the active layer 20 in the thin film transistor can be reduced significantly, the mobility characteristics of the thin film transistor can be effectively improved, and the operating efficiency of the thin film transistor can be improved. In a case that the display substrate according to embodiments of the present embodiment includes said thin film transistor, the operating performance of the display substrate and the display quality can be improved significantly.

Embodiments of the present disclosure also provide a display device which includes the display substrate provided by the above embodiments In the thin film transistor provided in said embodiments, by forming the active layer 20 as the grid-shaped structure including the plurality of silicon nanowires 201, interface traps between the gate electrode insulating layer GI and the active layer 20 in the thin film transistor can be reduced significantly, the mobility characteristics of the thin film transistor can be effectively improved, and the operating efficiency of the thin film transistor can be improved. In a case that the display substrate provided in said embodiment includes said thin film transistor, the operating performance of the display substrate and the display quality can be improved significantly.

Accordingly, the display device provided by the embodiments of the present disclosure, including said display substrate, also has said advantages, and thus will not be described in detail herein.

It should be noted that the display device can be any product or component with display function such as television, display, digital photo frame, mobile phone, tablet computer.

Embodiments of the present disclosure also provide a manufacturing method of the thin film transistor for manufacturing the thin film transistor according to the abovementioned embodiments, wherein the manufacturing method includes:
- a substrate 10 is provided;
- a plurality of silicon nanowires 201 extending along a first direction is manufactured on the substrate 10, wherein the plurality of silicon nanowires 201 form an active layer 20 of a grid-shaped structure, the active layer 20 includes a source electrode region 202 and a drain electrode region 203 which are oppositely arranged along the first direction, and the active layer 20 includes a channel region 204 which is located between the source electrode region 202 and the drain electrode region 203;
- a gate electrode 30 is manufactured on the substrate 10, wherein the gate electrode 30 extends along a second direction, the second direction intersects with the first direction; an orthographic projection of the gate electrode 30 onto the substrate 10 overlaps with an orthographic projection of the plurality of silicon nanowires 201 in the channel region 204 onto the substrate 10; and
- a source electrode and a drain electrode are manufactured on the substrate 10, wherein the source electrode is in contact with the plurality of silicon nanowires 201 in the source electrode region 202, and the drain electrode is in contact with the plurality of silicon nanowires 201 in the drain electrode region 203.

Specifically, the plurality of silicon nanowires 201 extending along the first direction are manufactured on the substrate 10, and the plurality of silicon nanowires 201 collectively form the active layer 20 of the grid-shaped structure. Each of the silicon nanowires 201 includes a portion located in the channel region 204, a portion located in the source electrode region 202, and a portion located in the drain electrode region 203. The conductivity of the portions of the silicon nanowires 201 located in the source electrode region 202 and the drain electrode region 203 is better than the conductivity of the portion of the silicon nanowires 201 located in the channel region 204. Illustratively, the portion of the silicon nanowires 201 located in the source electrode region 202 has a conductivity gradually decreasing in a direction towards the channel region 204. Illustratively, the portion of the silicon nanowires 201 located in the drain electrode region 203 has a conductivity gradually decreasing in a direction towards the channel region 204.

When the gate electrode 30 is manufactured, illustratively, firstly an Mo metal material is used to form a first Mo metal film layer, then an Al metal material is used to form an Al metal film layer, and subsequently an Mo metal material is used to form a second Mo metal film layer. The first Mo metal film layer, the Al metal film layer, and the second Mo metal film layer are patterned to form the gate electrode 30, wherein the gate electrode 30 includes a first gate electrode pattern, a second gate electrode pattern, and a third gate electrode pattern which are stacked in sequence along the direction away from the substrate 10, the first gate electrode pattern and the third gate electrode pattern are made of the Mo metal material, and the second gate electrode pattern is made of the Al metal material.

When the source electrode and the drain electrode are manufactured, illustratively, a metal material is used to form a source-drain metal film layer, and the source-drain metal film layer is patterned to form the source electrode and the drain electrode at the same time.

In a case that the thin film transistor adopts a top gate structure, the thin film transistor further includes the gate electrode insulating layer GI and the interlayer insulating layer ILD, and the specific process of manufacturing the thin film transistor is as follows: firstly the active layer 20 is manufactured on the substrate 10, then the gate electrode insulating layer GI is manufactured on a side of the active layer 20 facing away from the substrate 10, wherein the gate electrode insulating layer GI can cover the channel region 204 of the active layer 20, and subsequently a gate electrode 30 is manufactured on a side of the gate electrode insulating layer GI facing away from the substrate 10. The interlayer insulating layer ILD is manufactured on a side of the gate electrode 30 facing away from the substrate 10, and a first via hole and a second via hole are formed in the interlayer insulating layer ILD, wherein the first via hole is for exposing each of the silicon nanowires 201 located in the source electrode region 202 and the second via hole is for exposing each of the silicon nanowires 201 located in the drain electrode region 203. Finally, the source electrode and the drain electrode are manufactured on a side of the interlayer insulating layer ILD facing away from the substrate 10, wherein the source electrode can be in contact with each of the plurality of silicon nanowires 201 in the source electrode region 202 through the first via hole, and the drain electrode can be in contact with each of the plurality of silicon nanowires 201 in the drain electrode region 203 through the second via hole.

In a case that the thin film transistor adopts a bottom gate structure, firstly the gate electrode is manufactured on the substrate, then the gate electrode insulating layer is manufactured on a side of the gate electrode facing away from the substrate, wherein the gate electrode insulating layer can form a structure covering the entire face of the substrate, and subsequently the active layer is manufactured on a side of the gate electrode insulating layer facing away from the substrate. The source electrode and the drain electrode are then manufactured on a side of the active layer facing away from the substrate, wherein the source electrode can be in direct contact with the plurality of silicon nanowires in the source electrode region, and the drain electrode can be in direct contact with the plurality of silicon nanowires in the drain electrode region.

In the thin film transistor manufactured by the manufacturing method according to embodiments of the present disclosure, by forming the active layer 20 as the grid-shaped structure including the plurality of silicon nanowires 201, the interface traps between the gate electrode insulating layer GI and the active layer 20 in the thin film transistor can be reduced greatly, the mobility characteristics of the thin film transistor can be effectively improved, and the operating efficiency of the thin film transistor can be improved. In a case that the thin film transistor manufactured by the manufacturing method according to embodiments of the present disclosure is applied to a display device, the operating performance of the display device and the display quality can be improved.

As shown in FIGS. 4-8, in some embodiments, the substrate includes the glass substrate; the step that the plurality of silicon nanowires 201 extending along the first direction is manufactured on the substrate specifically includes the following.

Figure 4:
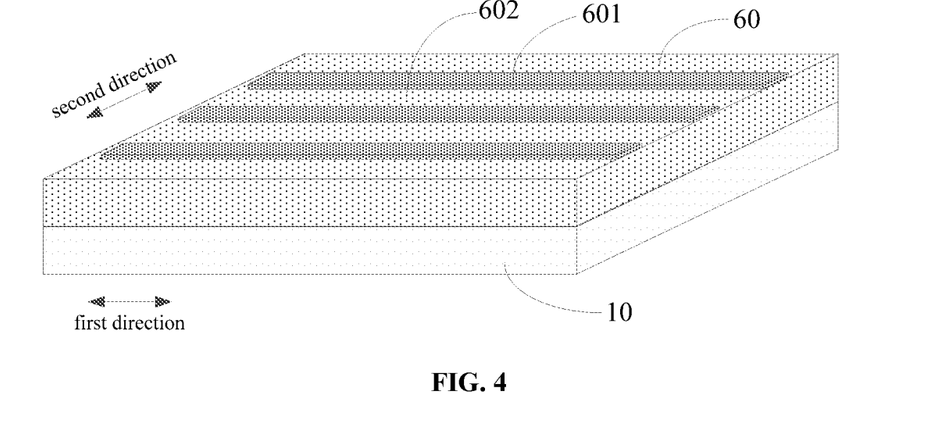
FIG. 4 is a schematic view of a dielectric layer having protruding structures arrange there on according to an embodiment of the present disclosure.

As shown in FIG. 4, the dielectric layer 60 is formed on the glass substrate, wherein a surface of the dielectric layer 60 facing away from the glass substrate includes a plurality of protruding structures 601 arranged in the grid shape, the protruding structures 601 extend along the first direction, and the protruding structure 601 include two first side faces extending along the first direction.

Specifically, the dielectric layer 60 can be formed by deposit silicon oxide (SiOx) on the glass substrate and the dielectric layer 60 is patterned, such that the plurality of protruding structures 601 arranged in the grid shape are formed on the surface of the dielectric layer 60 facing away from the substrate, the protruding structures 601 extend along the first direction, each of the protruding structures 601 include two first side faces extending along the first direction, and the two first side faces are oppositely arranged along the second direction. It should be noted that when patterning the dielectric layer 60, conventional exposure and development processes can be used, which will not be described in detail hereby. It is noted that when the surface of the dielectric layer 60 facing away from the substrate is formed as said structure, a guiding groove 602 for growing the silicon nanowires 201 is formed between two adjacent protruding structures 601, the two first side faces are two groove side walls extending along the first direction in the guiding groove 602, and illustratively, the width of the guiding groove 602 is at least about 2 μm.

Figure 5:
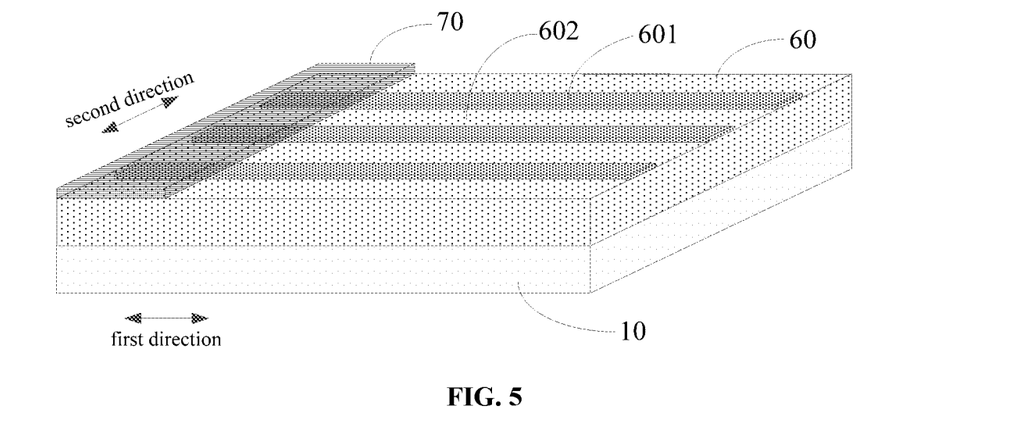
FIG. 5 is a schematic diagram of forming an indium source pattern according to an embodiment of the present disclosure.

As shown in FIG. 5, after the dielectric layer 60 is formed, an indium source pattern 70 is deposited on a surface of the dielectric layer 60 facing away from the glass substrate by adopting a magnetron sputtering process using an indium tin oxide material, wherein the indium source pattern 70 extends along the second direction. An orthogonal projection of the indium source pattern 70 onto the glass substrate overlaps with the orthogonal projection of an end of each of the plurality of protruding structures 601 along the first direction onto the glass substrate.

Figure 6:
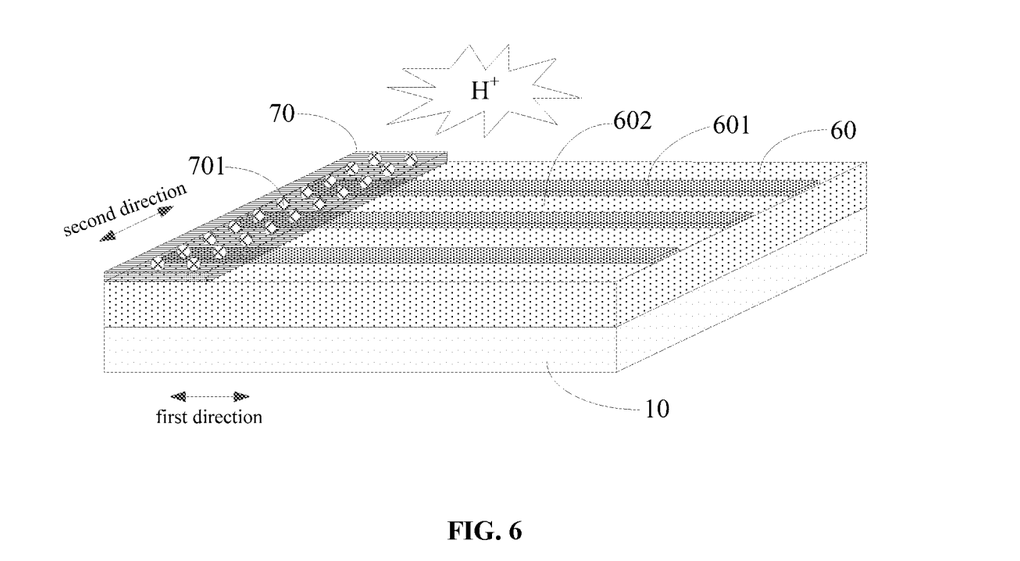
FIG. 6 is a schematic diagram of forming indium metal guiding particles according to an embodiment of the present disclosure.

As shown in FIG. 6, after the indium source pattern 70 is formed, the indium source pattern 70 is subjected to a hydrogen plasma bombardment treatment in an environment of 150° C. to 300° C. to form indium metal guiding particles 701 distributed on a surface of the indium source pattern 70, and the indium metal guiding particles 701 serve as a reducing agent for reducing amorphous silicon to grow into silicon nanowires 201.

Figure 7:
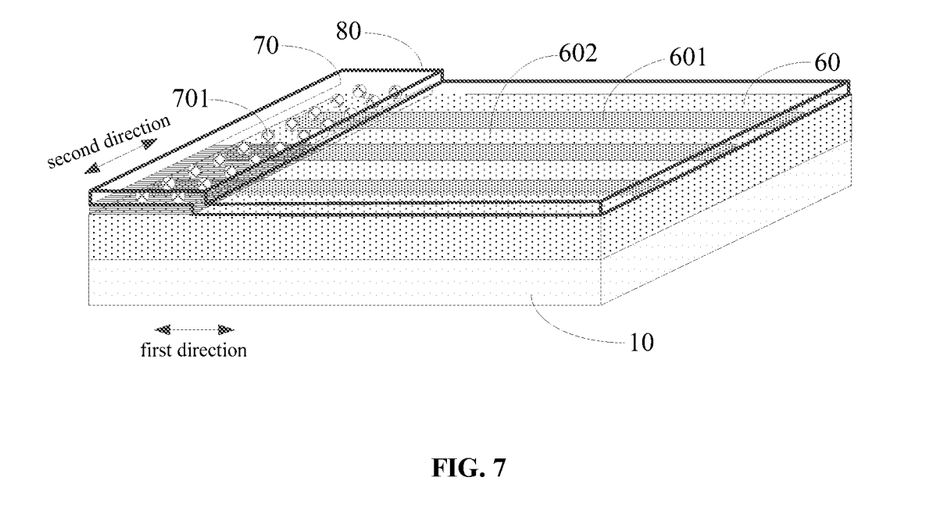
FIG. 7 is a schematic diagram of an amorphous silicon film layer according to an embodiment of the present disclosure.

As shown in FIGS. 7 and 8, subsequently, an amorphous silicon film layer 80 is deposited in an environment of 200° C., the amorphous silicon film layer 80 covers the indium source pattern 70, all of the protruding structures 601, and regions between adjacent protruding structures 601. In an inert reducing atmosphere (e.g. argon gas), a temperature of a chamber is raised to 250° C.-350° C., the substrate is heated to form an alloy droplet 90 of amorphous silicon and indium metal, and when the concentration of silicon in the alloy droplet 90 is supersaturated, the silicon crystal nucleus is precipitated; since the Gibbs free energy of the amorphous silicon is greater than the Gibbs free energy of the silicon crystal nucleus, the alloy droplet 90 move along the first direction as driven by the Gibbs free energy, and the precipitated silicon crystal nuclei are pulled to grow along two first side faces of each of the protruding structures 601 for about 30 minutes, thereby forming the plurality of silicon nanowires 201.

It is noted that the plasma bombardment treatment, depositing to form the amorphous silicon film layer 80, and the growth process of nanowires can all be performed in a PECVD (Plasma Enhanced Chemical Vapor Deposition) chamber. The temperature of the chamber can be controlled according to actual needs.

In the manufacturing method according to the above-mentioned embodiments, the grid-shaped active layer 20 including the plurality of silicon nanowires 201 can be formed on the glass substrate, which breaks through the technical barrier that the silicon nanowires 201 cannot be manufactured on the glass substrate in the convention art, and thus the manufacturing of polycrystalline silicon thin film transistor with a high mobility on glass substrate at low temperature can be realized.

In addition, when the thin film transistor is manufactured by the manufacturing method according to the above-described embodiments, it is possible to manufacture an active layer 20 of a large size, and thus a thin film transistor of the large size regardless of equipment limitations. Furthermore, when the thin film transistor is manufactured by the manufacturing method according to the above-described embodiments, current materials and manufacturing equipment can be used, and there is no need to modify the manufacturing equipment as well as introduce new materials.

Furthermore, when the active layer 20 is manufactured by the manufacturing method according to the above-described embodiments, by controlling a width of the protruding structures 601 on the dielectric layer 60 along the second direction and a distance between adjacent protruding structures 601 along the second direction, the density of the silicon nanowires 201 included in the active layer 20 can be controlled, and an active layer 20 including high-density silicon nanowires 201 can be manufactured.

In some embodiments, the manufacturing method further includes the followings.

After the substrate is provided, an organic film layer is manufactured on the substrate;

After the manufacturing of the thin film transistor is completed, the glass substrate is peeled off.

Specifically, the manufacturing method further includes the following. After the substrate is provided, the organic film layer manufactured on the substrate firstly; illustratively, the organic film layer includes the polyimide thin film.

After the organic film layer is formed, the active layer 20, the gate electrode 30, the source electrode, and the drain electrode are all formed on a side of the organic film layer facing away from the substrate. After the active layer 20, the gate electrode 30, the source electrode, and the drain electrode are formed, the glass substrate is peeled off to form the thin film transistor having a flexible substrate.

In the manufacturing method according to the above-mentioned embodiments, the thin film transistor having the flexible substrate is formed, and such a thin film transistor having the flexible substrate can be applied in the fields requiring flexibility and stretchability. That is, the thin film transistor can be applied to an AMOLED display device, which is beneficial to improve operating performances of the AMOLED display device, resulting in a greater breakthrough for the AMOLED.

In some embodiments, the manufacturing method further includes the following.

After the plurality of silicon nanowires 201 extending along the first direction are formed, the amorphous silicon material remaining in the amorphous silicon film layer 80 is converted into polycrystalline silicon.

Specifically, after the plurality of silicon nanowires 201 extending in the first direction are formed, some amorphous silicon remains (not shown in the figures), in the environment of 200° C., the remaining amorphous silicon material can be removed, and illustratively, can be converted into polycrystalline silicon, thereby improving the performance of the thin film transistor.

In some embodiments, the manufacturing method further includes the following.

After the plurality of silicon nanowires 201 extending along the first direction are formed, a passivation treatment is performed on the plurality of silicon nanowires 201.

Specifically, after the plurality of silicon nanowires 201 extending along the first direction is formed, the plurality of silicon nanowires 201 can be passivated with oxygen plasma gas, so that damage to the silicon nanowires 201 from the etching solution for forming the source electrode and the drain electrode subsequently can be prevented.

It should be understood that each of the embodiments described in the specification is intended to be presented in an enabling manner, similar elements can be referenced throughout the various embodiments, and each of the embodiments is intended to cover variations from the other embodiments. Particularly, the method embodiments are similar to product embodiments, and therefore are described briefly. For a related part, references can be made to some descriptions in the product embodiments.

Unless defined otherwise, the technical or scientific terms used in the present disclosure shall have the ordinary meaning as understood by those of ordinary skill in the art to which the present disclosure belongs. As used in the present disclosure, the terms "first", "second", and the like do not denote any order, quantity, or importance, but rather are used to distinguish different elements. The word "comprise" or "include", and the like, mean that an element or item preceding the word encompasses the element or item listed after the word and equivalents thereof, but does not exclude other elements or items. The word "connect", "couple", or the like is not limited to physical or mechanical connections, but may include electrical connections, whether direct or indirect. "Upper", "lower", "left", "right", etc. are merely used to denote relative positional relationships, which may be changed accordingly when an absolute position of a described object is changed.

It can be understood that when an element such as a layer, film, region, or substrate is referred to as being located "above" or "below" another element, the element can be "directly" located "above" or "below" another element or there may be any intervening element therebetween.

In the description of the above implementations, specific features, structures, materials, or characteristics may be combined in a suitable manner in any one or more embodiments or examples.

The above embodiments are merely specific implementations of the present disclosure, but the scope of protection of the present disclosure is not limited thereto, and any modification or substitution apparent to those skilled in the art without departing from the technical scope of the present disclosure shall covered by the scope of protection of the present disclosure. Accordingly, the scope of protection of the present disclosure is as set forth in the claims.

What is claimed is:

1. A thin film transistor, comprising:
a substrate;
an active layer, arranged on the substrate, wherein the active layer is formed as a grid-shaped structure, and the active layer comprises a plurality of silicon nanowires extending along a first direction, the active layer comprises a source electrode region and a drain electrode region oppositely arranged along the first direction, and a channel region located between the source electrode region and the drain electrode region;
a gate electrode, arranged on the substrate, wherein the gate electrode extends along a second direction, wherein the second direction intersects with the first direction, and an orthographic projection of the gate electrode onto the substrate overlaps with an orthographic projection of the plurality of silicon nanowires in the channel region onto the substrate; and
a source electrode and a drain electrode, arranged on the substrate, wherein the source electrode is in contact with the plurality of silicon nanowires in the source electrode region, and the drain electrode is in contact with the plurality of silicon nanowires in the drain electrode region;
wherein the thin film transistor further comprises a dielectric layer, wherein the dielectric layer comprises a plurality of protruding structures arranged in a grid shape, the protruding structures extend along the first direction, and the protruding structures each comprises two first side faces extending along the first direction;
wherein the silicon nanowires comprised in the active layer are in one-to-one correspondence with first side faces, and each of the silicon nanowires extends along a corresponding first side face.

2. The thin film transistor according to claim 1, wherein the source electrode is formed as a grid-shaped structure and the source electrode comprises a plurality of source electrode patterns extending along the second direction, wherein each source electrode pattern is in contact with the plurality of silicon nanowires in the source electrode region;
the drain electrode is formed as a grid-shaped structure and the drain electrode comprises a plurality of drain electrode patterns extending along the second direction, wherein each drain electrode pattern is in contact with the plurality of silicon nanowires in the drain electrode region.

3. The thin film transistor according to claim 1, wherein the thin film transistor further comprises:

a buffer layer, located between the substrate and the active layer, wherein the buffer layer is reused as the dielectric layer;

a gate electrode insulating layer, located on a side of the active layer facing away from the substrate, wherein the orthographic projection of the gate electrode insulating layer onto the substrate covers the orthographic projection of the channel region onto the substrate;

wherein the gate electrode is located on a side of the gate electrode insulating layer facing away from the substrate;

the thin film transistor further comprises an interlayer insulating layer, the interlayer insulating layer is located on a side of the gate electrode facing away from the substrate; and the source electrode and the drain electrode are both located on a side of the interlayer insulating layer facing away from the substrate, and the source electrode is in contact with a plurality of silicon nanowires in the source electrode region via a first via hole formed in the interlayer insulating layer; and the drain electrode is in contact with the plurality of silicon nanowires in the drain electrode region via a second via hole formed in the interlayer insulating layer.

4. The thin film transistor according to claim 1, wherein the thin film transistor further comprises:

a gate electrode insulating layer, located between the substrate and the active layer, wherein the gate electrode insulating layer is reused as the dielectric layer;

the gate electrode is located between the gate electrode insulating layer and the substrate, and the orthographic projection of the gate electrode onto the substrate is located inside an orthographic projection of the gate electrode insulation layer onto the substrate; and the source electrode and the drain electrode are both located on a side of the active layer facing away from the substrate.

5. The thin film transistor according to claim 1, wherein the substrate comprises a glass substrate or a flexible substrate.

6. A display substrate, comprising the thin film transistor according to claim 1.

7. A display device, comprising the display substrate according to claim 6.

8. The display substrate according to claim 6, wherein the source electrode is formed as a grid-shaped structure and the source electrode comprises a plurality of source electrode patterns extending along the second direction, wherein each source electrode pattern is in contact with the plurality of silicon nanowires in the source electrode region;

the drain electrode is formed as a grid-shaped structure and the drain electrode comprises a plurality of drain electrode patterns extending along the second direction, wherein each drain electrode pattern is in contact with the plurality of silicon nanowires in the drain electrode region.

9. The display substrate according to claim 6, wherein the thin film transistor further comprises a dielectric layer, wherein the dielectric layer comprises a plurality of protruding structures arranged in a grid shape, the protruding structures extend along the first direction, and the protruding structures each comprises two first side faces extending along the first direction;

wherein the silicon nanowires comprised in the active layer are in one-to-one correspondence with first side faces, and each of the silicon nanowires extends along a corresponding first side face.

10. The display substrate according to claim 9, wherein the thin film transistor further comprises:

a buffer layer, located between the substrate and the active layer, wherein the buffer layer is reused as the dielectric layer;

a gate electrode insulating layer, located on a side of the active layer facing away from the substrate, wherein the orthographic projection of the gate electrode insulating layer onto the substrate covers the orthographic projection of the channel region onto the substrate;

wherein the gate electrode is located on a side of the gate electrode insulating layer facing away from the substrate;

the thin film transistor further comprises an interlayer insulating layer, the interlayer insulating layer is located on a side of the gate electrode facing away from the substrate; and the source electrode and the drain electrode are both located on a side of the interlayer insulating layer facing away from the substrate, and the source electrode is in contact with a plurality of silicon nanowires in the source electrode region via a first via hole formed in the interlayer insulating layer; and the drain electrode is in contact with the plurality of silicon nanowires in the drain electrode region via a second via hole formed in the interlayer insulating layer.

11. The display substrate according to claim 9, wherein the thin film transistor further comprises:

a gate electrode insulating layer, located between the substrate and the active layer, wherein the gate electrode insulating layer is reused as the dielectric layer;

the gate electrode is located between the gate electrode insulating layer and the substrate, and the orthographic projection of the gate electrode onto the substrate is located inside an orthographic projection of the gate electrode insulation layer onto the substrate; and the source electrode and the drain electrode are both located on a side of the active layer facing away from the substrate.

12. The display substrate according to claim 6, wherein the substrate comprises a glass substrate or a flexible substrate.

* * * * *